(12) United States Patent
Roberts et al.

(10) Patent No.: US 8,230,294 B2
(45) Date of Patent: Jul. 24, 2012

(54) LOW DENSITY PARITY CHECK (LDPC) DECODER USING BROADCAST MESSAGING

(75) Inventors: Kim B. Roberts, Nepean (CA); Manoj Verghese, Ottawa (CA); James Harley, Nepean (CA); David Damian Nicholas Bevan, Bishops Stortford (GB)

(73) Assignee: Ciena Corporation, Linthicum, MD (US)

( * ) Notice: Subject to any disclaimer, the term of this patent is extended or adjusted under 35 U.S.C. 154(b) by 1028 days.

(21) Appl. No.: 12/182,575

(22) Filed: Jul. 30, 2008

(65) Prior Publication Data

US 2010/0031114 A1   Feb. 4, 2010

(51) Int. Cl.
*G06F 11/00* (2006.01)

(52) U.S. Cl. ........................................ 714/752; 714/751

(58) Field of Classification Search .................. None
See application file for complete search history.

(56) References Cited

U.S. PATENT DOCUMENTS

| | | | |
|---|---|---|---|
| 7,174,495 B2 | 2/2007 | Boutillon et al. | |
| 7,757,149 B2 * | 7/2010 | Xin et al. | 714/752 |
| 7,802,164 B2 * | 9/2010 | Hong et al. | 714/752 |
| 7,895,500 B2 * | 2/2011 | Sun et al. | 714/758 |
| 7,958,424 B2 * | 6/2011 | Kons et al. | 714/752 |
| 2007/0011564 A1 * | 1/2007 | Kons et al. | 714/758 |

FOREIGN PATENT DOCUMENTS

| | | |
|---|---|---|
| EP | 1482643 A2 | 12/2004 |
| WO | WO 2005/112272 A1 | 11/2005 |
| WO | WO 2007/044991 A2 | 4/2007 |

* cited by examiner

*Primary Examiner* — Michael Maskulinski
(74) *Attorney, Agent, or Firm* — Tyler S. Brown

(57) ABSTRACT

In a decoder implementing a belief propagation algorithm for iteratively decoding a Low Density Parity Check (LDPC) encoded data block, a method of computing messages to be sent by a first node of the decoder to at least one neighbor node of the decoder. The method comprises: processing messages received by the first node to remove an echo of a previous message sent by the first node to the at least one neighbor node in a previous iteration, to yield corresponding modified messages; computing a message for a current iteration using the modified messages; and broadcasting the computed message for the current iteration to each of the at least one neighbor nodes.

9 Claims, 4 Drawing Sheets

LOW DENSITY PARITY CHECK (LDPC) DECODER USING BROADCAST MESSAGING

CROSS-REFERENCE TO RELATED APPLICATIONS

This is the first patent application filed in respect of the present invention.

MICROFICHE APPENDIX

Not Applicable.

TECHNICAL FIELD

The present invention relates to high speed signal processing, and in particular to a Low Density Parity Check (LDPC) code process using broadcast messaging in a Belief Propagation algorithm.

BACKGROUND OF THE INVENTION

As is well known in the art, Low Density Parity Check (LDPC) code processes provide a high performance error correction technique for communications systems.

LDPC codes are a subset of what are more generally known as 'Sparse Graph Codes'. In this, their structure can be described in terms of a bipartite (or 'Tanner') graph, with two types of nodes, namely 'Variable Nodes' (VN) and Constraint (or 'Check') Nodes (CN). The number of VNs will typically correspond to the number of transmitted code bits in an encoded data block (such as a Forward Error Correction, FEC, block), and the number of CNs will correspond to the number of parity bits within the encoded data block.

By way of illustration only, FIG. 1 shows a bipartite graph of a rate-¼ low-density parity-check code with an encoded block length N=8, and M=6 constraints. A respective variable node (VN) is provided for each bit of the N=8-bit encoded data block. Each bit participates in j=3 constraints. Each constraint is implemented by a respective constraint node (CN), each of which operates to force the sum of the bits received from its k=4 neighbour VNs to an even value.

Within the Tanner graph of FIG. 1, VNs are connected to CNs are joined by bidirectional links (or 'edges'). A node which is connected to a first node via an edge is known as the 'neighbour' of the first node, and vice versa. The number of edges leaving a node (or, equivalently, the number of neighbours of that node) defines the 'degree' of a node, with node degrees typically being in the range of 2-16. The code structure can also be defined in the form of a conventional 'Parity Check' matrix, H, which is a sparse distribution of 1s within a matrix which otherwise consists only of zeros. Each column of the H matrix corresponds to a VN, and each row corresponds to a CN. Each edge connecting a VN to a neighbour CN within the Tanner graph corresponds with a 1 in the H matrix where the corresponding rows and columns intersect. The H matrix corresponding to the Tanner graph of FIG. 1 is:

$$H = \begin{bmatrix} 1 & 1 & & 1 & & 1 & & \\ & 1 & 1 & 1 & & & & \\ 1 & 1 & & & 1 & 1 & & 1 \\ & & & 1 & & 1 & 1 & 1 \\ & 1 & & 1 & & & 1 & 1 \\ 1 & & & & 1 & 1 & & 1 \end{bmatrix}$$

The degree of a VN is equal to the weight (i.e. number of 1s) of the corresponding column, and the degree of a CN is equal to the weight of the corresponding row. FIG. 2 shows an alternative view of the LDPC of FIG. 1, in which the bidirectional edges of the Tanner graph are illustrated using a physically realizable grid of lines extending from each node.

As noted above, each CN defines an even parity check constraint, in that it forces the sum of the bits (variable nodes) to which it is connected to an even value. Let us consider whether a given bit sequence d (i.e. sequence of 1s and 0s) can be considered to be a valid codeword. First we need to write the 1s and 0s into the VNs. Then we need to check that each CN is connected to an even number of VNs containing the value 1. If this condition is satisfied for all of the CNs, then the bit sequence we are considering qualifies as a valid codeword for this particular LDPC code. An equivalent representation of this process is to post-multiply (modulo 2) the parity check matrix H by the bit sequence d (a column vector). If the result (the 'syndrome') is all zeros:

$$Hd = [0\ 0\ 0\ \ldots\ 0]^T \qquad (1)$$

then the bit sequence is a valid codeword for the LDPC codeword defined by H. The 'codebook' of H is defined as the set of bit sequences which satisfy equation (1).

The example LDPC code described above with reference to FIGS. 1 and 2 utilizes 8 VNs and 6 CNs, which is appropriate for the case of an encoded blocklength of N=8 bits, and M=6 constraints. While this is sufficient for illustration purposes, practical implementations will normally be designed for very much larger encoded block sizes. For example, encoded blocks of N=20,000 bits or larger may be used, implying a Tanner graph having an equivalent number (e.g. N=20,000) of variable nodes (VNs). For a useful LDPC code of rate 0.75, an encoded block of N=20,000 bits would imply a requirement for 5000 CNs.

As is well known in the art, LDPC decoding can be implemented in software, hardware, or a combination of the two. For very high speed systems (for example, in a FEC decoder for processing a channel signals having a line rate of 40 Gbps or faster), hardware implementations are normally preferred.

As is also known in the art, for encoded block sizes large enough to provide reasonable performance, all of the effective decoding strategies for low-density parity-check codes are message-passing algorithms. The best algorithm known in the art is the sum-product algorithm, also known as iterative probabilistic decoding or belief propagation. A brief description of the Belief Propagation (BP) algorithm is provided below. This algorithm may sometimes be referred to as the "Message-Passing Algorithm" (MPA) or the "Sum-Product Algorithm" (SPA). We will prefer the term "Belief Propagation" in the present application, but may in some places use the various terms interchangeably.

The structure of the BP algorithm is tightly linked to the structure of the code's Tanner graph. Each VN and CN operates to compute and pass messages to their immediate neighbour nodes, in lockstep, along the edges of the graph. A message cycle from each VN to its neighbour CNs, and then from each CN to its neighbour VNs, is considered to constitute a single "iteration" of the belief propagation algorithm. The messages calculated by any given VN represents what that VN "believes" is the likelihood that it's bit value within the decoded block has a logical value of "0"; based on the Log-Likelihood Ratio (LLR) information sample for that bit position obtained from the received signal, and the messages received from its neighbour CNs during the previous iteration. Mathematically, this may be represented as:

$$V_i = Vn - Cm_i, \ i=1\ldots j$$

where: $V_i$ is the message output to the $i^{th}$ CN; $Cm_i$ is the message received from the $i^{th}$ CN; and $$Vn = \sum_{h=1}^{j} Cm_h + LLR(x),$$

where LLR(x) is the LLR sample value for that VN's bit position obtained from the received signal.

The message calculated by any given CN, and sent to a given neighbour VN represents what that CN "believes" is the likelihood that the neighbour VN's bit value within the decoded block has a logical value of "0"; based on the most recent messages received from the other VNs to which that CN is connected. Mathematically, this may be represented as:

$$Cm_i = \text{Sign}(Vm_i) \prod_{h=1}^{k} \text{Sign}(Vm_h) \theta \left[ \sum_{h=1}^{k} \theta(Vm_h) - \theta(Vm_i) \right],$$

i=1 ... k

Where $Cm_i$ is the message sent to the $i^{th}$ VN; $Vm_i$ is the message received from the $i^{th}$ VN; and $Vm_h$, h=1 ... k are the messages received from all of the k neighbour VNs to which the CN is connected.

With each successive iteration, the confidence level in the logical value taken by each VN will tend to increase. Normally, the BP algorithm will iterate until a predetermined criterion is satisfied. Typical criteria may include a maximum permitted number of iterations; or determining that each CN is connected to an even number of VNs containing the value 1, as described above.

As may be seen in the above equations, the message sent to each node explicitly excludes the effects of the message received from that node. Thus, in the example of FIGS. 1 and 2 a VN is connected to three neighbour CNs, and so will compute a respective message for a given neighbour CN which takes into account the VN's LLR sample and only the messages received from the other two of its neighbour CNs. The messages sent by a CN to each of its neighbour VNs is restricted in the same manner. Thus, in the example of FIGS. 1 and 2 a CN is connected to four neighbour VNs, and so will compute a respective message for a given neighbour VN which takes into account only the messages received from the other three of its neighbour VNs. This avoids a problem of the probability computed by a VN during each iteration being distorted by its own probability calculation from the previous iteration.

Following the above description it will be appreciated that, in general, every node computes and sends a uniquely different message to each of its neighbours during each iteration. For software implementations of the PB algorithm, this results in a requirement for the computation and buffering of a very large number ([N*j]+[M*k]) of messages during each iteration, which is time consuming, and thus limits the maximum line rate of a signal that can be successfully decoded using this technique. Hardware implementations may avoid this problem by allowing each node to be implemented by a respective computation block, to thereby exploit the speed of massively parallel processing for calculation of messages. However, in this scenario, the edges of the Tanner graph must also be implemented using physical connections between processing blocks. In this respect, it will be recalled that high speed physical wire connections inside an integrated circuit are generally implemented to be un-idirectional. In a Complementary Metal Oxide Semiconductor (CMOS) integrated circuit, bidirectional connections generally suffer unduly from excessive capacitance, increased heat dissipation, and multiplexing delays. As such, physically implementing bi-directional connections between nodes requires two nominally parallel physical connections, one for carrying messages in each direction. Consequently, a hardware implementation of the LDPC code will require [N*j]+[M*k] discrete wire connections between nodes. These issues create a problem in that, for encoded block sizes large enough to provide reasonable performance, it is extremely difficult to achieve a practical solution for routing the physical connections between the code blocks.

In that respect, it may be noted that the arrangement illustrated in FIG. 2 is, at least in theory, physically realizable in an integrated circuit. However, it will be seen that as the number of nodes increases, the number of physical connections also must increase, as will the amount of area of the integrated circuit devoted to those connections. It will also be seen that the average length of connections between nodes will be approximately one-half the dimension of the integrated circuit. For an LDPC having enough VNs and CNs to provide reasonable performance, and implemented on an IC that is small enough to provide a reasonable yield (e.g. approximately 4 cm² or less), this can result in several kilometres of wire connections within the integrated circuit. The heat generated within such long lengths of wire connections can pose a still further barrier to successful implementation of a practical LDC integrated circuit.

Techniques enabling implementation of LDPC codes in high speed signal processing systems remain highly desirable.

SUMMARY OF THE INVENTION

An aspect of the present invention provides, in a decoder implementing a belief propagation algorithm for iteratively decoding a Low Density Parity Check (LDPC) encoded data block, a method of computing messages to be sent by a first node of the decoder to at least one neighbour node of the decoder. The method comprises: processing messages received by the first node to remove an echo of a previous message sent by the first node to the at least one neighbour node in a previous iteration, to yield corresponding modified messages; computing a message for a current iteration using the modified messages; and broadcasting the computed message for the current iteration to each of the at least one neighbour nodes.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION OF PREFERRED EMBODIMENTS

Figure 1:
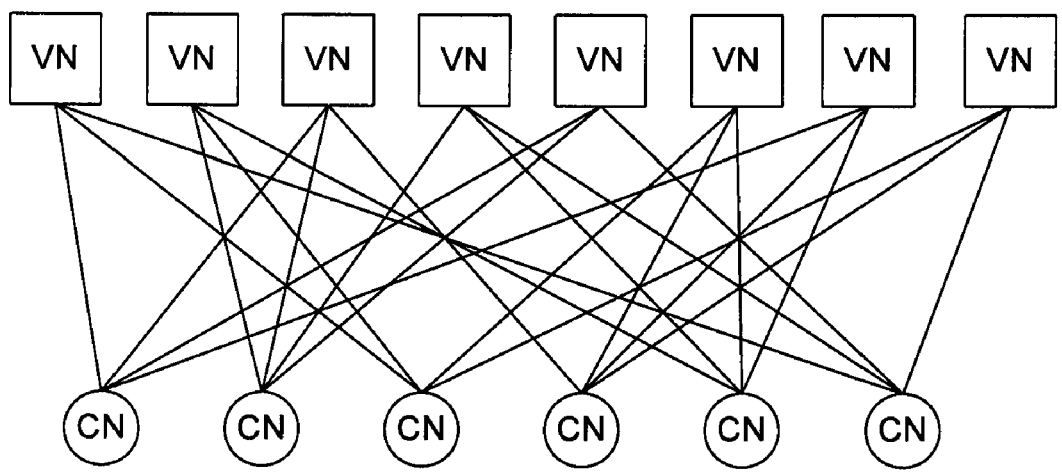
FIG. 1 shows a Tanner graph of a representative Low Density Parity Check (LDPC) decoder known in the prior art.

The present invention provides techniques enabling implementation of LDPC codes in high-speed signal processing systems. Embodiments of the present invention are described below, by way of example only, with reference to FIGS. 3 and 4.

In very general terms, the present invention provides a technique which enables the Belief Propagation algorithm to be implemented using common messages between neighbour nodes. With this arrangement, software implementations benefit from a dramatic reduction in the number of messages that must be computed and buffered; while hardware implementations benefit because physical connections between nodes can be dramatically simplified.

In an embodiment of the invention, the computation of messages, by any given node, includes an initial step of processing each message received by the node to remove an "echo" of the message sent by that node to its neighbours in the previous iteration. It this respect, the term "echo" is used herein to refer to terms or components of a message received from a neighbour node, which terms are the product of that neighbour node's processing of a message previously received by that neighbour node. For Example, the message computation performed in a given VN may be represented as follows:

The VN receives a respective message $$Cn_i = \prod_{h=1}^{k} \text{Sign}(Vn-1_{i,h}) \sum_{h=1}^{k} \theta(Vn-1_{i,h}),$$

i=1 . . . j from each of its j neighbour CNs; where $Vn-1_{i,h}$, h=1 . . . k, are the messages received by the $i^{th}$ CN from each of its k neighbour VNs during the previous iteration. Each message $Cn_i$ contains one or more "echo" terms, which correspond with the message $(Vn-1_i)$ sent to the $i^{th}$ CN, by this VN, during the previous iteration. In order to remove this echo, each of the received messages $Cn_i$, i=1 . . . j are processed as follows:

$$Cm_i = \text{Sign}(Vn\_old) \prod_{h=1}^{k} \text{Sign}(Vn-1_{i,h}) \theta \left[ \sum_{h=1}^{k} \theta(Vn-1_{i,h}) - \theta(Vn\_old) \right],$$

$i = 1 \ldots j$ i=1 . . . j where $Cm_i$ is the modified message received from the $i^{th}$ CN, and Vn_old is the message sent by the VN to each of its j neighbour CNs during the previous iteration. The message Vn to be sent to each of the j neighbour CNs during the current iteration can then be computed as:

$$Vn = \sum_{i=1}^{j} Cm_i + LLR(x)$$

This value of Vn is then assigned as the updated value of Vn_old for use in the next iteration.

The message computation performed in a CN may be represented as follows:

The CN receives a respective message $Vn_h$, h=1 . . . k, from each of the k neighbour VNs to which it is connected. As noted above, each of these messages contains an "echo" of the messages previously sent by the CN to each of the neighbour VNs during the previous iteration. Accordingly, the received messages are processed as follows:

$$Vm_h = Vn_h - Cn\_old$$

Where $Vm_h$ is the modified value from the $h^{th}$ neighbour VN, and Cn_old is the message value sent to each of the neighbour VNs during the previous iteration. The message to be sent to each of the k neighbour VNs in the current iteration can then be computed as:

$$Cn = \prod_{h=1}^{k} \text{Sign}(Vm_h) \sum_{h=1}^{k} \theta(Vm_h)$$

As may be seen, the calculation of Vn and Cn in each node differs from conventional methods primarily in that each node stores the message value that it calculated in the previous iteration, and then subtracts the effects of this value from the messages received from its neighbour nodes, prior to calculating the new message for the current iteration. This arrangement increases the complexity of each computation block (node) because each node must carry forward the results of the previous iteration. However, this yields a benefit in that each node calculates a single message, which is then broadcast to every neighbour node to which it is connected.

Figure 2:
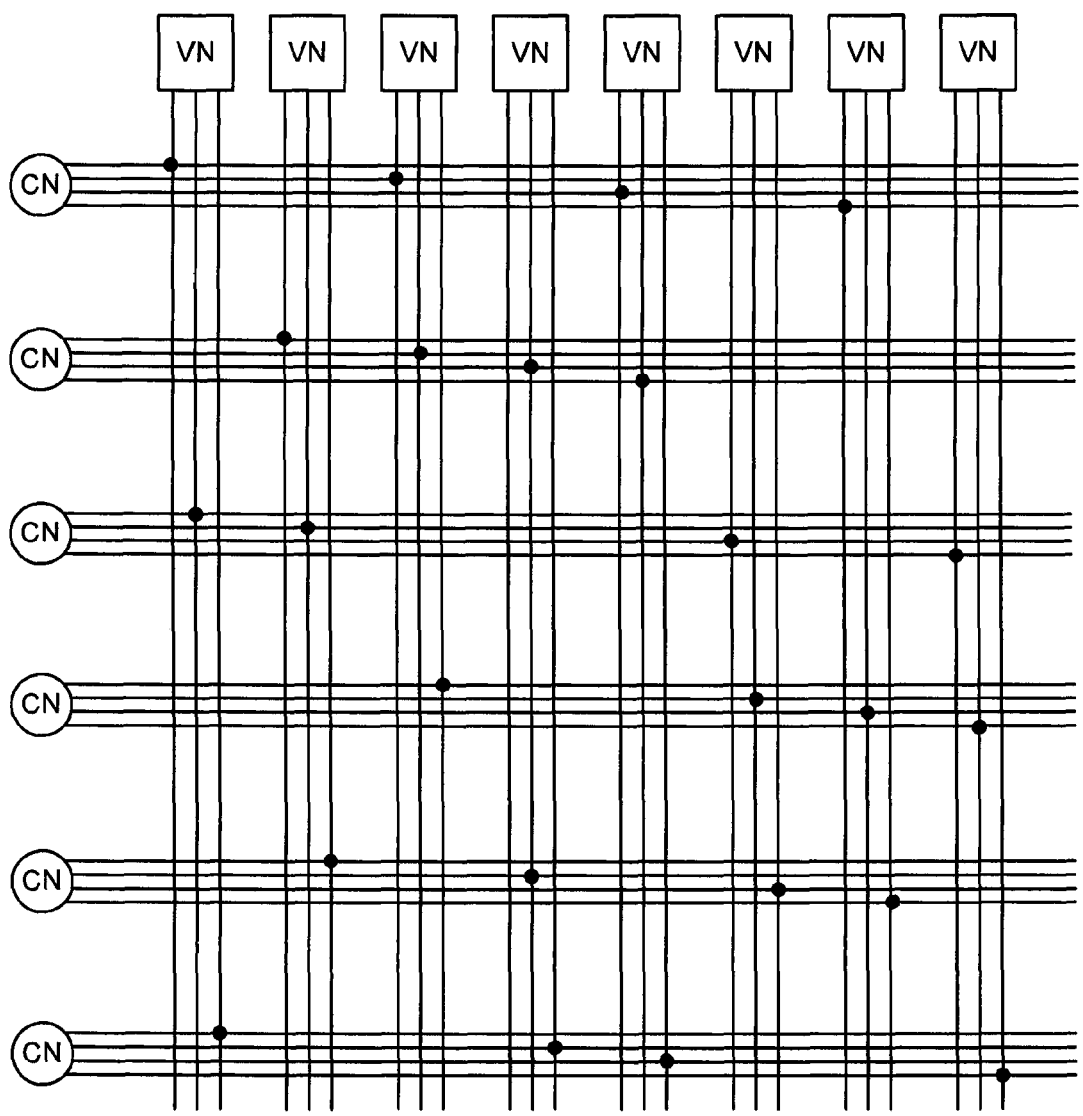
FIG. 2 shows an alternate view of the LDPC decoder of FIG. 1.
Figure 3:
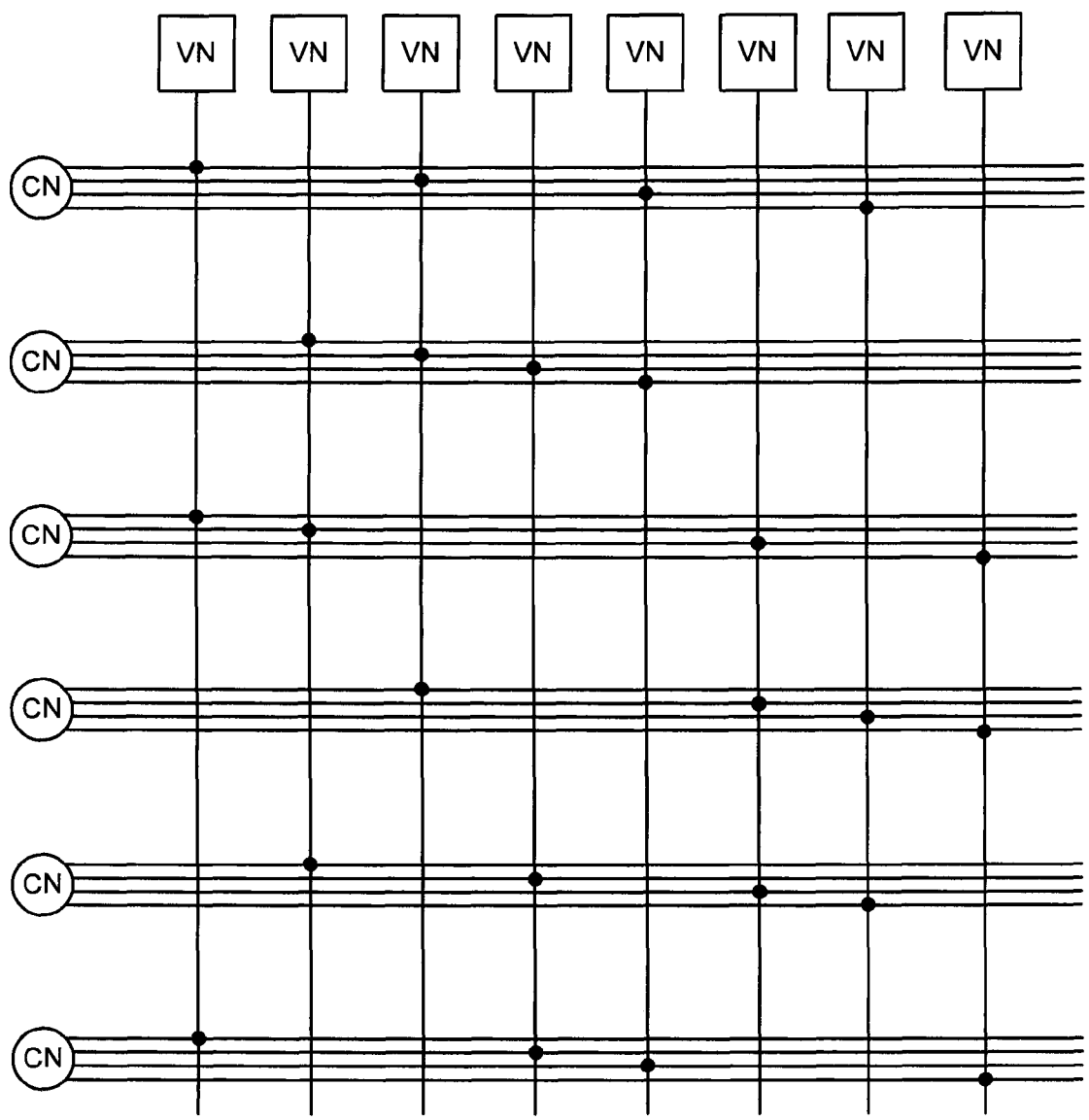
FIG. 3 schematically illustrates bus connections for broadcasting messages from each Variable Node to its neighbour Check Nodes in an LDPC decoder, in accordance with an embodiment of the present invention.
Figure 4:
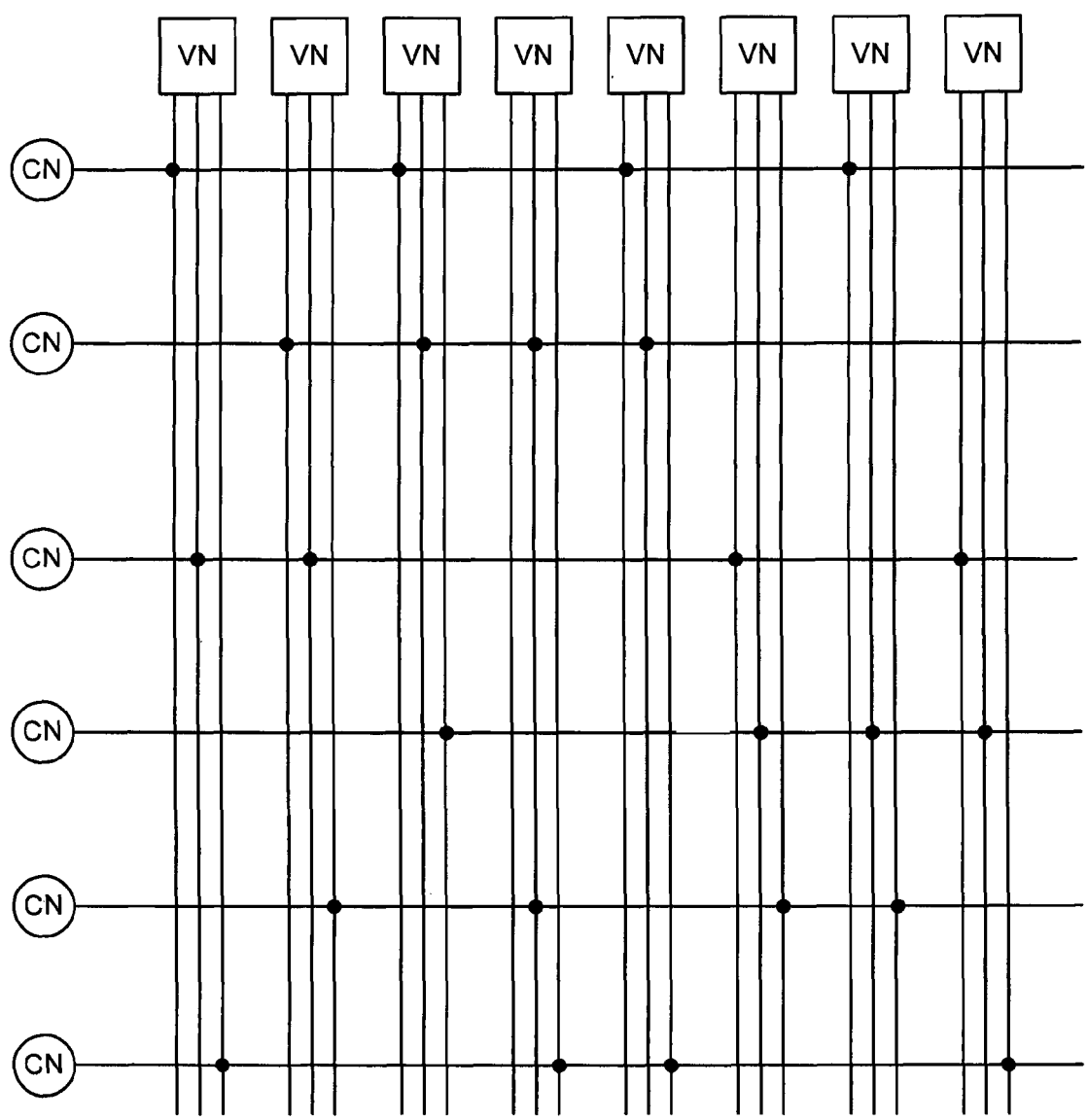
FIG. 4 schematically illustrates bus connections for broadcasting messages from each Check Node to its neighbour Variable Nodes in an LDPC decoder, in accordance with an embodiment of the present invention.

In the case of a software implementation, this means that a total of M+N messages must be calculated and buffered during each iteration, which is dramatically less than the [N*j]+[M*k] messages required in conventional methods. A similar reduction, in the number of physical connections that must be made, can be obtained in the case of hardware implementations. FIGS. 3 and 4 illustrate representative connections for the case of messages broadcast from the VNs to the CNs, and from the CNs to the VNs, respectively. Comparison between FIG. 2 and each of FIGS. 3 and 4 clearly highlights the reduction in the number of physical connections, recalling that, in prior art arrangements, the connections of FIG. 2 must be duplicated for each direction of signal transfer. In effect, the present invention enables the implementation of a bus architecture, rather than individual physical connections, for conveying messages from a node to each of its neighbour nodes.

As may be appreciated, the use of a bus architecture greatly reduces both the number of individual wire connection that must be implemented within an IC, the total wire length, and the complexity of the IC layout. The cost of these reductions is an increase in node complexity which, for hardware implementations, is reflected in an increased number of logic gates.

However, this is considered to be an acceptable trade-off, since the power consumed by the additional gates is normally less than that saved by reducing the number and length of wire connections. Furthermore, the reduction in IC layout complexity obtained by adopting the bus architecture more than off-sets the slight increase of complexity implied by the additional logic gates in each node. It is anticipated that these that these benefits can be enhanced by utilizing any of a variety of bus optimization techniques, known in the art.

In the foregoing description, a VN processes messages received from any given neighbour CN to remove the echo related to the message that the VN sent to that neighbour CN in the previous iteration. This is an example of "direct" echo compensation. Those of ordinary skill in the art will recognise, however, that directly analogous methods may be used to compensate "indirect" echo; in which the received message is processed to remove terms related to a message received by the neighbour node from some other node. Indirect echo compensation may be used to mitigate the effects of finite girth in the Tanner graph. Other forms of echo may also be compensated using directly analogous techniques. Examples of echoes are single, multiple, direct, indirect, first return, subsequent return, and linear or nonlinear combinations of echoes. Some or all of the echoes present can be compensated on a given iteration.

Similarly, those of ordinary skill in the art will recognise that the present invention is not limited to the specific echo compensation techniques utilized in the above example. Other algorithms can be used and other echo reduction methods employed. The echo reduction can for example be complete, approximate, or partial.

The echoes in the illustrated example are echoed beliefs contained within numerical message values. However, this is not essential. In embodiments in which messages are represented in other physical quanta, (such as voltages, currents, frequencies, duty cycle, etc.), the echoes will normally take a similar form, and appropriate compensation techniques used.

The echo compensation can be static, predetermined, adaptive, or learned. The Tanner graph is generally static and predetermined, but can be dynamic, adaptive, or otherwise not fully characterized. For example, a training bit pattern or training iteration can be used to measure direct and indirect echoes in the current Tanner graph.

Encoding in the transmitter should be such that the Tanner graph is useful, and generally matched the Tanner graph being processed. The most common application of this processing is for correction of bit errors. The symbols processed can contain more than one bit of information. The application can be other or more than correction of errors. For example, performance monitoring or signal processing.

The example iterative algorithm uses binary digital messages with numerical content that represents a log probability. Messages can comprise binary, multilevel, analog, pulse width, duty cycle, or other modulations. The iterations illustrated are finite discrete and synchronous, but they can be for example asynchronous, a continuum, regular, irregular, with random cadence, terminating, diverging or indefinite.

The LDPC belief propagation algorithm is advantageously implemented within a high speed CMOS Application Specific Integrated Circuit (ASIC) for correction of transmission errors in 40 or 100 Gb/s optical transmission systems. Other hardware implementations include a Field Programmable Gate Array (FPGA), a local collection of a plurality of ASICs, FPGAs, circuits, and or processors. Minimization of the distance between nodes is generally important in order to minimize heat and delay, giving a strong advantage to implementation within a single ASIC.

The embodiment(s) of the invention described above is(are) intended to be representative only. The scope of the invention is therefore intended to be limited solely by the scope of the appended claims.

We claim:

1. In a Low Density Parity Check (LDPC) code process implementing an iterative belief propagation algorithm, a method of computing messages to be sent by a first node to at least one neighbour node, the method comprising, in a current iteration of the algorithm:
   processing one or more messages received by the first node, from at least one of the neighbour nodes, to at least partially remove an echo of a prior message sent to at least one of the neighbour nodes in a previous iteration;
   computing, a message using the processed messages;
   broadcasting the computed message from the first node to each of the neighbour nodes; and
   wherein the previous iteration is more than one iteration prior to the current iteration.

2. The method of claim 1, wherein the prior message sent to at least one of the neighbour nodes is a message broadcast from the first node to each of the neighbour nodes during the previous iteration.

3. The method of claim 1, wherein the prior message sent to at least one of the neighbour nodes is a message broadcast from a second node to at least one of the neighbour nodes during the previous iteration.

4. The method of claim 1, wherein first node is a Variable Node (VN) of the decoder, and the messages received by the first node arc represented by $$Cn_i = \prod_{h=1}^{k} \text{Sign}(Vn - 1_{i,h}) \sum_{h=1}^{k} \theta(Vn - 1_{i,h}), i = 1 \ldots j,$$

and wherein processing the messages received by the first node comprises computing:

$$Cm_i = \text{Sign}(Vn\_old) \prod_{h=1}^{k} \text{Sign}(Vn - 1_{i,h}) \theta\left[\sum_{h=1}^{k} \theta(Vn - 1_{i,h}) - \theta(Vn\_old)\right],$$
$$i = 1 \ldots j$$

where $Cm_i$ is the modified message corresponding the $Cn_i$; and Vn_old is the previous message sent by the VN to each of its j neighbour nodes during the previous iteration.

5. The method of claim 4, wherein computing the message for a current iteration comprises computing $$Vn = \sum_{i=1}^{j} Cm_i + LLR(x)$$

where Vn is the message for the current iteration; and LLR(x) is a Log-Likelihood Ratio (LLR) information sample for a bit position of the VN within the encoded data block.

6. The method of claim 1, wherein first node is a Check Node (CN) of the decoder, and the messages received by the first node are represented by $Vn_h$, $h=1 \ldots k$, and wherein processing the messages received by the first node comprises computing:

$$Vm_h = Vn_h - Cn\_old$$

where $Vm_h$ is the modified value from the $h^{th}$ neighbour node, and $Cn\_old$ is the message value sent to each of the neighbour nodes during the previous iteration.

7. The method of claim 6, wherein computing the message for a current iteration comprises computing $$Cn = \prod_{h=1}^{k} \text{Sign}(Vm_h) \sum_{h=1}^{k} \theta(Vm_h).$$

8. A forward error correction (FEC) decoder for decoding a Low Density Parity Check (LDPC) encoded data block using an iterative belief propagation algorithm, the FEC decoder comprising: a first node configured to communicate with at least one neighbour node, the first node being operative, in a current iteration of the iterative belief propagation algorithm to: process messages received from the neighbour nodes to at least partially remove an echo of a prior message received by at least one of the neighbour nodes in a previous iteration wherein the previous iteration is more than one iteration prior to the current iteration, to yield corresponding modified messages; and compute a message using the modified messages; and means for conveying the computed message from the first node to each of the neighbour nodes.

9. The FEC decoder as claimed in claim 8, wherein the means for conveying the computed message from the first node to each of the neighbour nodes comprises a bus connection between an output of the first node and a respective input of each neighbour node.

* * * * *